United States Patent [19]

Ando et al.

[11] Patent Number: 4,783,243

[45] Date of Patent: Nov. 8, 1988

[54] ARTICLES COMPRISING METAL-COATED POLYMERIC SUBSTRATES AND PROCESS

[75] Inventors: Hiei Ando, Stamford, Conn.; Dale E. Hall, Rockville, Md.

[73] Assignee: American Cyanamid Company, Stamford, Conn.

[21] Appl. No.: 944,281

[22] Filed: Dec. 18, 1986

[51] Int. Cl.[4] ................................................ C25D 5/02
[52] U.S. Cl. ........................................ 204/15; 204/20; 428/458; 428/461
[58] Field of Search ............................. 204/15, 20–22, 204/30, 49; 428/461, 458

[56] References Cited

U.S. PATENT DOCUMENTS

| 3,306,830 | 2/1967 | Bittrich et al. | 204/30 |
| 3,340,607 | 9/1967 | Shutt | 204/30 |
| 3,918,927 | 11/1975 | Wells | 204/20 |
| 4,244,789 | 1/1981 | Palagos | 204/20 |
| 4,336,028 | 6/1982 | Tomibe et al. . | |
| 4,364,739 | 12/1982 | Tomibe et al. . | |
| 4,410,593 | 10/1983 | Tomibe et al. . | |
| 4,556,507 | 12/1985 | Tomibe et al. . | |
| 4,556,508 | 12/1985 | Tomibe et al. . | |

FOREIGN PATENT DOCUMENTS 60-258494  12/1985  Japan .

OTHER PUBLICATIONS

Mueller and Baudrand, "Plating on Plastics" (Robert Draper Ltd.), 1971, Chapter 3, pp. 15–21.

*Primary Examiner*—R. L. Andrews
*Attorney, Agent, or Firm*—Michael J. Kelly; Steven H. Flynn

[57] ABSTRACT

Improved articles are disclosed having a polymeric substrate containing a polymer, such as polyamide, and a metallic sulfide, such as copper sulfide, and a thin, uniform, and firmly adherent overlayer of an eletrodepositable metal, such as nickel. The metal overlayer may be continuous or selectively patterned over the polymeric substrate. The metal layer provides the articles with decorative, protective and electrically conductive characteristics without significantly diminishing polymeric properties.

10 Claims, No Drawings

ARTICLES COMPRISING METAL-COATED POLYMERIC SUBSTRATES AND PROCESS

This application is related to the following assigned concurrently filed patent applications:

| Attorney's Docket No. | Serial No. | Applicant(s) | Title |
|---|---|---|---|
| 110-191 (29,953II) | 06/944,235 | Hiei Ando Dale Edward Hall | Process For The Production of Metal Coated Fibers |
| 110-191 (29,953I) | 06/944,307 | Hiei Ando Dale Edward Hall Maurice M. Zwick | Metal Coated Fibers and Articles Made Therefrom |

The present invention relates to improved articles comprising metal-coated plastics and a process for making same. More particularly, it pertains to improved articles having a polymeric substrate containing a polymer and a metallic sulfide and a layer of at least one electrodepositable metal that is thin, uniform, and firmly adherent to the substrate. The polymeric substrate may be electroplated directly, obviating the need for elaborate etching, cleaning or metallizing treatments. These metal-coated articles are intended to be used in the manufacture of decorative automotive parts, decorative plastic packaging and electronic applications, e.g., electronic housings for EMI shielding, printed circuit boards, and flexible plastic circuitry for electronic devices.

BACKGROUND OF THE INVENTION

Electroplated plastics have found widespread applications. Disadvantageously, non-conductive plastics do not lend themseleves well to the electroplating process. In fact, electroplating metal coatings onto nonconductive plastics is a complex process that requires extensive pretreatment to render the surface conductive. In "Plating of Plastics", 1971, chapter 3, pages 15-21, Mueller and Baudrand describe the principles of plating on plastics. Three stages are necessary in order to electroplate plastics. First is the preparation of the surface of the plastic to receive a conductive coating. Second is the application of the conductive layer itself. The final stage is the actual electroplating process. The first stage, surface preparation entails procedures to make the plastic surface water wettable for proper metal deposition, e.g., chemical etching, conditioning, mechanical roughening and sensitising. All of these treatments are time-consuming and contribute significantly to the manufacturing costs.

As an alternative to surface pretreatment abovedescribed, conductive fillers, e.g., carbon black, metal powder of flake, have been blended with the polymer before the part or article is fabricated. Such blending adds to the complexity and cost of the manufacturing operation. Furthermore, in order to achieve sufficient electrical conductivity for plating, high filler contents are often required. In the case of additives, such as carbon black or other powders, the structural properties of the article may be adversely affected. In other cases, the fillers are quite expensive, e.g., graphite fiber.

In still yet other methods, polymeric fibers, films, sheets and the like have been treated to make them somewhat electrically conductive. Such treatments are described to be useful for polymers having pendant cyano groups, e.g., polyacrylonitrile or modacrylics, mercaptan groups, thiocarbonyl groups, quaternary ammonium groups and the like. Representative of such techniques are those of Tomibe et al., U.S. Pat. Nos. 4,336,028; 4,364,739; 4,410,593; 4,556,507; and 4,556,508. In '508, there are disclosed products which are characterized as electrically conducting materials comprising a polymer or copolymer selected from polyesters, aromatic polyamides, polyurethanes, polycarbonates, polyamides, polyamideimides, polyphenols, polyethers, polyvinylalcohols and polyethylene oxides, suitably treated, if necessary, e.g., with dicyandiamide, or by grafting with acrylonitrile, to make them receptive to a sulfide of a metal selected from copper, cobalt, tin, mercury or lead, alone, or in combination with a sulfide of a metal selected from silver, gold and elements of the platinum group. At Col. 2, lines 50-56, it is stated that the materials may be in the form of a powder or in the form of a shaped body such as a film, plate, fiber, fabric, paper, sheet, block, pellet, thread, string, rod or pipe. There is absolutely no hint or suggestion that such materials can be used as substrates for electroplating or that they do not need to be etched prior to subsequent electroplating.

It has now been unexpectedly discovered that if such shaped polymeric articles are made to contain metallic sulfide, e.g., copper sulfide, to make them electrically conductive and then electroplated, there is no need to elaborately condition them by surface pretreatments and the use of conductive fillers can be avoided. The metal coatings obtained will, however, have the important advantages of being thin, relatively uniform and firmly adherent.

It has also been discovered that polymeric articles can be rendered conductive and then electroplated with metal in a pattern. Such can then be used in special electronics applications, e.g., printed circuit boards and flexible plastic circuitry for electronic devices. These metal-coated articles are highly advantageous for one or more reasons. First, good electrical conductivities are achieved with a simple, inexpensive process and starting materials. Secondly, because only the surface of the polymeric substrate is reacted, the physical and mechanical properties of the plastic are not diminished. Thirdly, because the conductive material is added after the polymeric substrate has been formed into a shaped article, conventional processing operations, such as casting, molding, and extruding can be carried out.

SUMMARY OF THE INVENTION

Provided in accordance with the present invention are improved articles of manufacture having a polymeric substrate and at least one electrodepositable metal layer on at least a portion thereof, said improvement comprising polymeric substrate containing a polymer and a metallic sulfide, thereby producing said metal layer being thin, uniform, and firmly adherent to said polymeric substrate.

In preferred features, the polymeric substrate contains a polyamide which contains copper sulfide.

Among the features of the invention are articles as above defined, wherein the weight percentage of metal, e.g., copper sulfide expressed in terms of the weight of metal, e.g., copper is from about 1 to about 30 percent based on the weight of the surface layer of the polymeric substrate. In general the thickness of the surface layer is dependent on the nature of the substrates and how vigorous the conditions for treatment with metal sulfide. In general, however, the upper limit is about 20 microns for the surface layer. The thickness of the metal layer or layers, in preferred embodiments ranges from about 0.05 to about 100 microns. Especially preferably, the coatings will be at least about 5 microns thick and most preferably at least about 20 microns thick. Special mention is made of polymeric articles wherein the polymeric substrate comprises a polyamide which is receptive to and contains copper sulfide, and the metal layer comprises nickel, copper or chromium and especially nickel.

In preferred embodiments, the electrodepositable coating metals will be nickel, silver, chromium, zinc, copper, lead, cadmium, tin, cobalt, gold, indium, iron, palladium, platinum, tellurium or an alloy of any of the foregoing, without limitation, but preferably nickel or chromium.

In preferred features, the process will use substrates of a number of organic polymeric materials, all of which can be made electrically conductive by impregnation with copper sulfide. Included will be, without limitation, polyamide substrates such as nylons, e.g., poly(caprolactam) and poly(1,6-hexamethylenediamine adipate), and the so-called aramids, which are long chained synthetic polyamides in which at least 85% of the amide linkages are attached directly to two aromatic rings.

Also provided are articles, above defined, wherein the plating is affixed to selected patterns on the surface of said substrate.

Further provided are patterned articles, above defined wherein said pattern has been produced by rendering portions of said substrate surface non-conductive by anodic pretreatment, and thereafter electroplating them.

DETAILED DESCRIPTION OF THE INVENTION

The polymeric materials for use as substrates in the articles of this invention are numerous and generally any known polymeric material may find application. By way of illustration, some of the known polymeric materials useful in the invention include: polyesters, polyethers, polycarbonates, epoxies, phenolics, epoxynovolacs, epoxy-polyuethanes, urea-type resins, phenol-formaldehyde resins, melamine resins, melamine thiourea resins, urea-aldehyde resins, alkyd resins, polysulfide resins, vinyl organic prepolymers, multifunctional vinyl ethers, cyclic ethers, cyclic esters, polycarbonate-co-esters, polycarbonate-co-silicones, polyetheresters, polyimides, bismaleimides, polyamides, polyetherimides, polyamideimides, polyetherimides, and polyvinyl chlorides. The polymeric material may be present alone or in combination with copolymers, and compatible polymeric blends may also be used. Preferred are polymeric articles made of polyamides.

Electrically conductive polymeric articles can be made according to procedures known in this art. In one procedure, electrically conductive polymeric articles are obtained by treating the articles in a bath containing divalent copper ions, a reducing agent capable of reducing the divalent copper ions to monovalent copper ions and a sulfur-containing compound which is capable of reacting with the monovalent copper ions to produce cuprous sulfide or cupric sulfide. This one-step treatment is described in the above-mentioned U.S. Pat. No. 4,336,028. A suitable specific procedure is set forth in Example 1 of the '028 patent and Example 1 herein.

Another procedure is set forth in the aforementioned Tomibe et al., U.S. Pat. No. 4,556,507 (Col. 3, lines 22–48). For polyamides and similar materials, a technique comprising grafting acrylonitrile onto the substrate and then reacting with a bath as described above is shown in Example 4 of U.S. Pat. No. 4,556,508.

The process for electrodepositing metal coatings on conductive polymeric articles may be carried out in one of two methods: continuous or selectively patterned electrodeposited metallic coating.

In the continuous method, the conductive polymeric article is immersed into a plating tank which contains a soluble salt or salts of the metal(s) to be plated. The tank also contains an anode of either the soluble or insoluble type. The conductive polymeric article is connected to the cathodic, negative, terminal of a current source and plated with a uniform continuous coating.

In the selectively patterned method, the conductive polymeric article is selectively masked using a photoresist, patterned plastic, or by other means of covering areas of the surface to be plated to render them inaccessible to electrolyte. The masked polymeric article is immersed into an acid electrolyte and anodized for a short time, i.e., a few minutes or less. When anodization is complete, the article is removed from the acid electrolyte, washed, and dried. The anodization process renders the exposed portions of the surface non-conductive.

The resist or other masking means is then removed and the article is plated in the above-described continuous method, so that all conductive parts of the surface are in contact with the source of current. In this way, a patterned metal coating can be electrodeposited.

Plating can be carried out on the conductive polymeric article directly after combining with metallic sulfide. No conventional surface sensitization pretreatments are needed as taught by the prior art. While not essential maximum adhesion of the metal coating can be obtained if the article is fabricated with a microroughened surface either by chemical etching or mechanically.

PROCEDURE

If a polymeric article in the form of a grid and comprised of polyamide is given a treatment in accordance with U.S. Pat. No. 4,556,508, Example 4, there will be produced a substrate containing a conductive amount of copper sulfide which can be used for this invention. The substrate, about $\frac{1}{4}$ inch thick, having about $\frac{1}{4}$ inch dimensional grids about $1\frac{1}{2}$ inches square is immersed in an aqueous bath containing 20 g/l of cupric sulfate, 3 g/l of nickel sulfate, 3 g/l of silver nitrate, 20 g/l of sodium thiosulfate, 10 g/l of sodium hydrogen sulfite, 30 g/l of sodium hydrogen phosphate and 12 g/l of citric acid and heat-treated at 50° C. for 3 hours.

DESCRIPTION OF THE PREFERRED EMBODIMENTS

The following examples illustrate the present invention. They are not to be construed to limit the claims in any manner whatsoever.

EXAMPLE 1

A wire is attached to a conductive grid typical of those made in accordance with the above Procedure. The grid is immersed into a beaker containing a nickel plating solution comprising:
nickel sulfate: 39.2 oz/gal nickel chloride: 11.4 oz/gal
nickel as metal: 11.5 oz/gal
boric acid: 4.0 oz/gal
saccharin: 0.62 oz/gal The plating solution is heated to 60° C. and adjusted to pH 4.2. The beaker contains an expanded nickel sheet as the anode. Plating is carried out for 1 minute at an applied current of 0.8A. The plating voltage is 2V. When plating is complete, the grid is washed and dried.

Visual examination of the product obtained in Example 1 indicates that the grid is plated with a uniform, continuous coating of lustrous nickel. When the grid is snapped in half, there is no peeling or flaking off of nickel in the stressed area. The nickel coating breaks cleanly.

EXAMPLE 2

A conductive polymeric article in the form of a grid is provided with a metallic coating in a pre-determined area as follows: A wire is attached to the grid as an electrical connection. The lower half of the grid is immersed into an aqueous solution of sulfuric acid adjusted to a pH of 3. The cell also contains a cathode made of expanded nickel sheet. The lower half of the grid is anodized using an applied voltage of 12V for 30 seconds. The grid is then removed from the sulfuric acid, rinsed, and dried. Resistance measurements made with a digital multimeter show that the anodized portion of the grid is electrically non-conducting.

The grid is then wholly immersed into a nickel plating solution and plated using conditions essentially employed in Example 1. The article is removed from the plating solution, rinsed, and dried.

Visual examination of the plastic grid reveals that a nickel coating has been electrodeposited only on the upper half of the grid, i.e., on the section which has not been anodized.

The foregoing patents and publications are incorporated herein by reference. Many variations of the present invention will suggest themselves to those skilled in this art in light of the above, detailed description. For example, polyacrylonitrile and aramids can be substituted as polymers in place of polyamide. Polyamide articles containing silver sulfide or silver sulfide and copper sulfide for electrical conductivity can be substituted. An electrolytic chromium bath can be used to provide a chromium layer. Multiple metal coatings can also be applied, e.g., chromium over nickel, chromium over nickel over copper can also be applied, and the like. All such variations are within the full intended scope of the invention as defined in the appended claims.

We claim:

1. An improved article of manufacture having a polymeric substrate and at least one electrodepositable metal layer on at least a portion thereof, said improvement comprising said polymeric substrate containing a polymer and a metallic sulfide, and said metal layer being thin, uniform, and firmly adherent to said polymeric substrate.

2. An article as defined in claim 1 wherein said polymeric substrate is a polyamide which is receptive to and which contains copper sulfide.

3. An article as defined in claim 2 wherein the weight percentage of copper sulfide expressed in terms of the weight of metallic copper is from about 1 to about 30 percent based on the weight of the surface layer of said polymeric substrate.

4. An article as defined in claim 1 wherein the thickness of said metal or layer ranges from about 0.05 to about 100 microns.

5. An article as defined in claim 4 wherein the thickness is at least about 5 microns.

6. An article as defined in claim 5 wherein the thickness is at least about 20 microns.

7. An article as defined in claim 1 wherein said electrodepositable metal comprises nickel.

8. An article as defined in claim 1 wherein the plating is affixed in selected patterns on the surface of said substrate.

9. An improved article of manufacture having a polymeric substrate and at least one electrodepositable metal layer on at least a portion thereof, said improvement comprising said polymeric substrate containing a polymer and a metallic sulfide, and said metal layer being thin, uniform and firmly adherent to said polymeric substrate wherein the plating is affixed in selected patterns on the surface of said substrate by rendering portions of said substrate non-conductive by anodic pretreatment prior to deposition of said metal layer thereon.

10. A process for the preparation of an article as defined in claim 1, said process comprising the steps of:
   (a) providing a polymeric substrate containing a metallic sulfide;
   (b) immersing said substrate in a solution capable of electrodepositing at least one metal on said substrate;
   (c) supplying a quantity of electricity between said immersed substrate as a cathode and an electrodepositable metal in said solution as an anode; and
   (d) maintaining the supply of electricity until a thin, uniform and firmly adherent layer of said metal is deposited on at least a portion of said substrate.

* * * * *